United States Patent

Von Ammon et al.

[11] Patent Number: 6,153,008
[45] Date of Patent: Nov. 28, 2000

[54] DEVICE AND METHOD FOR PULLING A SINGLE CRYSTAL

[75] Inventors: Wilfried Von Ammon, Burghausen; Hans Ölkrug, Tittmoning; Erich Dornberger, Burghausen; Franz Segieth, Kirchham, all of Germany

[73] Assignee: Wacker Siltronic Gesellschaft für Halbleitermaterialien AG, Burghausen, Germany

[21] Appl. No.: 09/045,348

[22] Filed: Mar. 20, 1998

[30] Foreign Application Priority Data

Mar. 21, 1997 [DE] Germany .......................... 197 11 922

[51] Int. Cl.[7] .............................. C30B 15/14; C30B 15/22
[52] U.S. Cl. ................................ 117/13; 117/34; 117/217
[58] Field of Search ................................ 117/3, 13, 217, 117/34

[56] References Cited

U.S. PATENT DOCUMENTS

| 5,441,014 | 8/1995 | Tomioka et al. ........................ 117/213 |
| 5,487,354 | 1/1996 | von Ammon et al. .................... 117/13 |
| 5,567,399 | 10/1996 | Von Ammon et al. . | |

FOREIGN PATENT DOCUMENTS

| 1316707 | 12/1962 | France . |
| 4414947 | 8/1995 | Germany . |
| 404016589A | 1/1992 | Japan . |
| 761889 | 8/1993 | Japan . |
| 2182262 | 5/1987 | United Kingdom . |
| WO 92/18672 | 10/1992 | WIPO . |

OTHER PUBLICATIONS von Ammon, Wilfried et al., "The dependence of bulk defects on the axial temperature gradient of silicon crystals during Czochralski growth", vol. 151 No. 3/4 (Jun. 1995): 273–277.

Dornberger, Erich et al., "The dependence of ring–like distributed stacking faults on the axial temperature gradient of growing Czochralski crystals", vol. 143 No. 5 (May 1996): 1648–53.

*Primary Examiner*—Benjamin L. Utech
*Assistant Examiner*—Donald L. Champagne
*Attorney, Agent, or Firm*—Collard & Roe, P.C.

[57] ABSTRACT

Device for pulling a silicon single crystal 1 includes an element 5 which annularly surrounds the single crystal growing at a crystallization boundary; and the element has a face 6 directed at the single crystal. The element surrounds the single crystal substantially level with the crystallization boundary 2 and has the property of reflecting heat radiation radiated by the single crystal and the similar melt or of generating and radiating heat radiation back to the lower part of the crystal close to the crystallization boundary. There is also a method for pulling a silicon single crystal, in which the single crystal is thermally affected using the element surrounding it.

4 Claims, 2 Drawing Sheets

DEVICE AND METHOD FOR PULLING A SINGLE CRYSTAL

BACKGROUND OF THE INVENTION

1. Field of the Invention

The present invention relates to a device for pulling a silicon single crystal, comprising an element, which annularly surrounds the single crystal growing at a crystallization boundary and this element has a face directed at the single crystal. The invention furthermore relates to a method for pulling a silicon single crystal, in which the single crystal is pulled at a pull rate V chosen in such a way that the ratio V/G is equal to the value $1.3*10^{-3}$ cm$^2$min$^{-1}$K$^{-1}$±20%, preferably ±10%, where is the axial temperature gradient in the region of the crystallization boundary.

2. The Prior Art

German Publication DE-4,414,947 A1, describes silicon semiconductor wafers which are separated from a single crystal as sometimes having a stacking fault ring. The occurrence of a stacking fault ring is closely connected with the pull rate V and the axial temperature gradient G in the region of the crystallization boundary. According to the empirically derived formula V/G=$1.3*10^{-3}$ cm$^{-2}$min$^{-1}$K$^{-1}$, it is possible to specify a lower pull rate, above which a stacking fault ring just starts to occur.

The prior art furthermore describes that the stacking fault ring causes separate regions within the semiconductor wafer which are characterized by the presence of different types of defects and different defect densities (E. Doxnberger and W. V. Ammon, Journal Of The Electrochemical Society, Vol. 143, No. 5, 1996). This literature reference also discloses that, with the customarily employed pulling method, the temperature gradient in the region of the crystallization boundary is not constant. This is because the temperature gradient changes in the radial direction, when viewed along the longitudinal axis of the crystal.

SUMMARY OF THE INVENTION

It is an object of the present invention to avoid any substantial variation in the axial temperature gradient in the region of the crystallization boundary in the radial direction. This object is achieved according to the present invention by providing a device for pulling a silicon single crystal, said silicon single crystal having a longitudinal axis and growing at a crystallization boundary, comprising an element which annularly surrounds the silicon single crystal and said element having a face directed at the single silicon crystal; said element surrounding the silicon single crystal substantially level with the crystallization boundary; and said element having means for reflecting heat radiation radiated by the silicon single crystal back toward the crystallization boundary.

In addition, the present invention provides a device for pulling a silicon single crystal, said silicon single crystal having a longitudinal axis and growing at a crystallization boundary, comprising an element which annularly surrounds the silicon single crystal and said element having a face directed at the silicon single crystal; said element surrounding the silicon single crystal substantially level with the crystallization boundary; and said element having means for generating and radiating heat toward the lower part of the growing crystal close to the crystallization boundary.

This object is furthermore achieved according to the present invention by providing a method for pulling a silicon single crystal, and said crystal having a crystallization boundary region, comprising the steps of pulling the silicon single crystal at a pull rate V selected in such a way that the ratio V/G has the value of $1.3*10^{-3}$ cm$^2$min$^{-1}$K$^{-1}$ ±20%, preferably ±10%, and G is an axial temperature gradient in the silicon single crystal in the region of the crystallization boundary; and thermally affecting the silicon single crystal by using an element surrounding said crystal substantially level with the crystallization boundary region.

The control, adjustment and standardization of the axial temperature gradient G in the region of the crystallization boundary can be achieved by means of the invention. This makes it possible to produce semiconductor wafers with definitively adjustable defect characteristics.

BRIEF DESCRIPTION OF THE DRAWINGS

Other objects and features of the present invention will become apparent from the following detailed description considered in connection with the accompanying drawing which discloses several embodiments of the present invention. It should be understood, however, that the drawing is designed for the purpose of illustration only and not as a definition of the limits of the invention.

In the drawings, wherein the same reference characters denote the same features throughout the separate views.

DETAILED DESCRIPTION OF PREFERRED EMBODIMENTS

Figure 1:
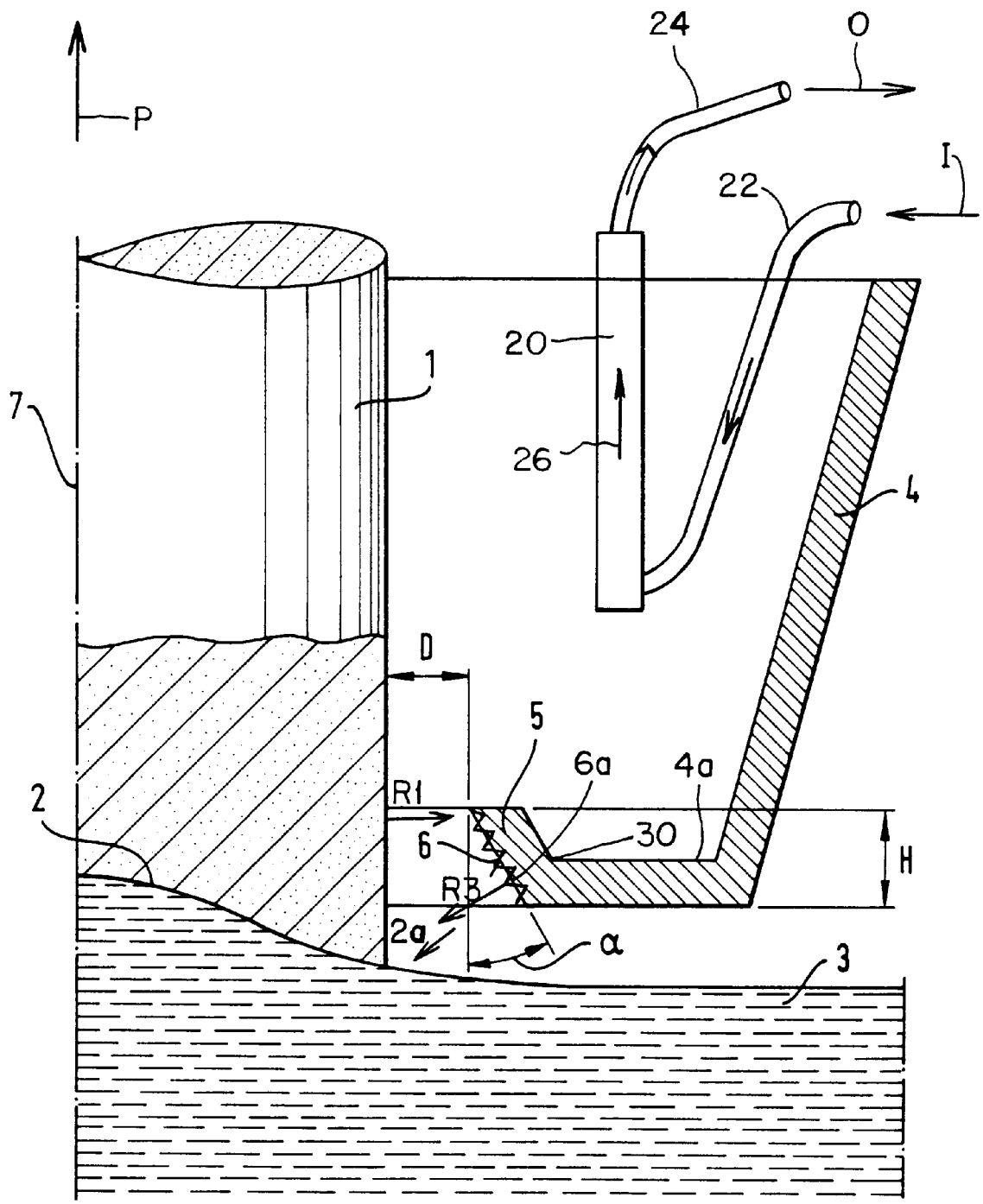
FIG. 1 shows a longitudinal section view of the invention device through a growing single crystal, with only the right-hand half being shown due to the axial symmetry for heat reflection.
Figure 2:
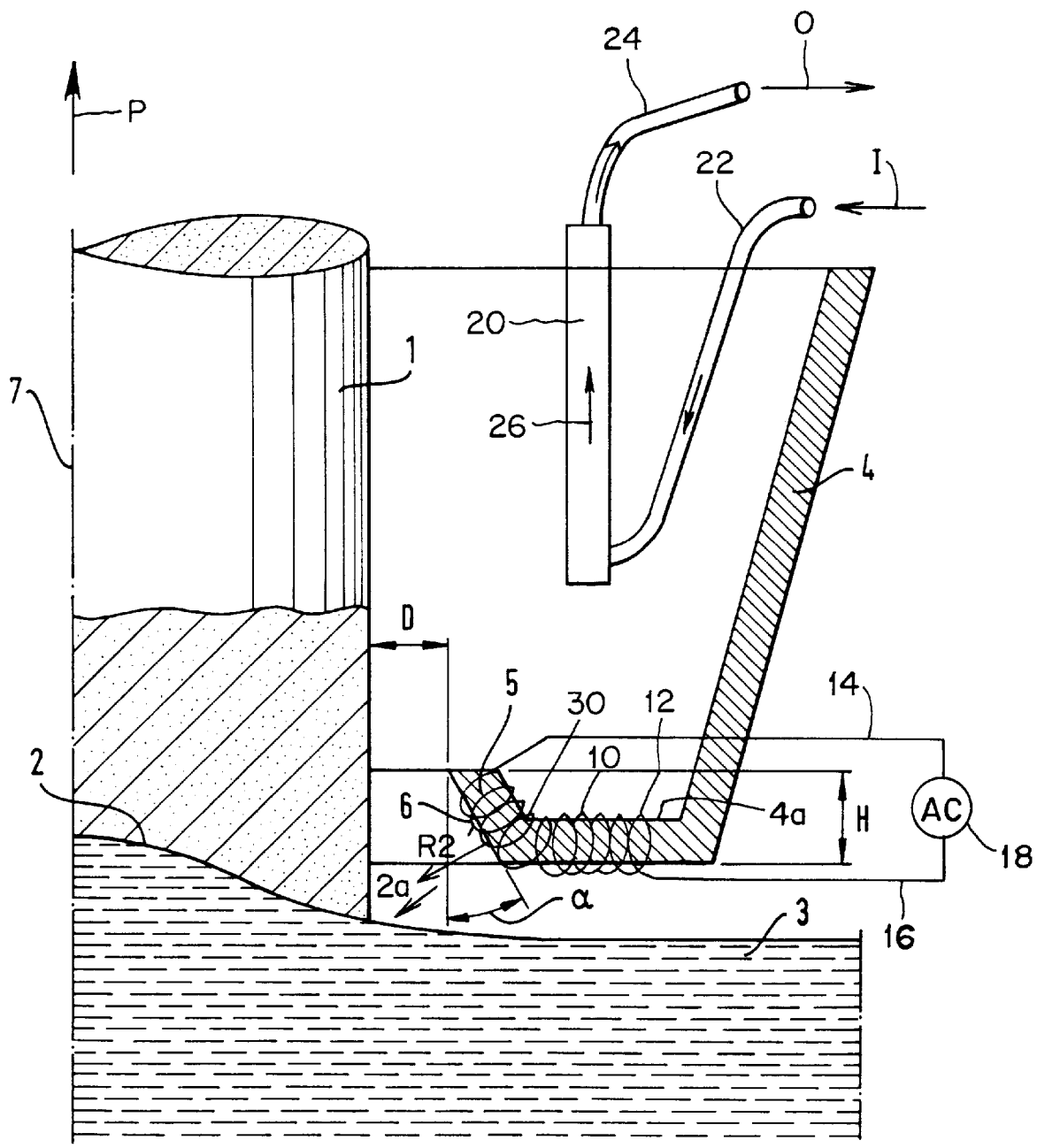
FIG. 2 shows a second embodiment of the device of the invention showing heat radiation.

Turning now in detail to the drawings, FIGS. 1 and 2 show the single crystal 1, which is preferably made of silicon, growing at a crystallization boundary 2. The material needed for the growth is delivered by a melt 3. Around the single crystal, a heat shield 4 is arranged which may be of known construction. In the region 2a of the crystallization boundary, this shield is connected to an element 5 which extends to within a distance D from the single crystal. The distance D is preferably from 10 to 50 mm. The element 5 has a face 6 directed at the single crystal 1 and extends over a height H in the pull direction P. The height H is preferably from 25 to 100 mm. The face 6 is inclined by an angle a relative to the longitudinal axis 7 of the single crystal, preferably in the direction of the single crystal. The angle a preferably ranges from 0 to 60°. The face 6 need not necessarily be in a straight plane, but may, for example, also be curved such as of concave shape or of convex shape.

The element 5 is arranged substantially level with the crystallization boundary 2, so that the region 2a of the crystallization boundary can be thermally affected using the element of the invention. In the context of the invention, the region 2a of the crystallization boundary is counted as the crystallization boundary 2 and a region extending up to 2 mm into the single crystal.

In order to make it possible to adjust, to standardize and to control the axial temperature gradient in the radial direction element 5 is utilized. In the first embodiment shown in FIG. 1, element 5 is very highly reflective of the heat radiation R1 radiated from the single crystal to element 5. Alternatively, in the second embodiment of FIG. 2, element 5 is capable of generating and radiating heat by radiation R2 from element 5 to the single crystal. In the first embodiment of FIG. 1, the element 5, or at least its face 6, is made from a material having a high heat reflection capacity for producing reflected heat radiation R3 from the polished surface 6a to crystal 1. For example element 5 can be made of polished molybdenum or of polished graphite having the polished surface 6a. In the second embodiment of FIG. 2, the element 5 is constructed as a radiant heating element, preferably as a resistive radiant heater 10. For example, heater 10 is shown as a ring heater which is connected by leads 14 and 16 to an A.C. (alternating currents) or D.C. (direct current) power source 18.

To further improve the radial homogeneity of G, active cooling may be carried out above the element. For example, it is possible to provide an active cooling instrument, as described for example in U.S. Pat. No. 5,567,399, above the element. This disclosure of this patent is herewith incorporated by reference. Also, FIGS. 1 and 2 show a cooler 20 having a coolant inflow tube 22 and a coolant outflow tube 24. Thus, coolant liquid 26 such as water enters at arrow I and exits at arrow O.

In the drawing, element 5 is shown integrally connected at boundary 30 to the heat shield 4 along the lower edge 4a of the heat shield. However, the element 5 need not be connected to the heat shield 4. Instead, it can also be fastened to a frame independently of the heat shield.

While several embodiments of the present invention have been shown and described, it is to be understood that many changes and modifications may be made thereunto without departing from the spirit and scope of the invention as defined in the appended claims.

What is claimed is:

1. Method for pulling a silicon single crystal, and said silicon single crystal having a crystallization boundary region, comprising the steps of pulling the silicon single crystal from a silicon melt at a pull rate V selected in such a way that the ratio V/G has the value of $1.3*10^{-3}$ cm$^2$min$^{-1}$K$^{-1}$±10%, and G is an axial temperature gradient in the silicon single crystal in the region of the crystallization boundary and in order to improve a radial homogeneity of G;

providing a heat shield annularly surrounding said silicon single crystal and having a lower edge; and connecting an element to the lower edge of the heat shield, said element annularly surrounding the silicon single crystal and said element having a face directed at the silicon single crystal, and said element face annularly surrounding the silicon single crystal substantially level with the crystallization boundary; and thermally affecting the silicon single crystal by using said element surrounding said crystal substantially level with the crystallization boundary region; and said thermally affecting comprises having heat radiation radiating from said silicon single crystal and the silicon melt to said face of said element; and reflecting said heat radiation from the silicon single crystal and the silicon melt back to the crystallization boundary region using said face of the element;

thereby avoiding any substantial variation in the axial temperature gradient in the region of the crystallization boundary in the radial direction.

2. Method for pulling a silicon single crystal, and said silicon single crystal having a crystallization boundary region, comprising the steps of pulling the silicon single crystal at a pull rate V selected in such a way that the ratio V/G has the value of $1.3*10^{-3}$ cm$^2$min$^{-1}$K$^{-1}$±10% and G is an axial temperature gradient in the silicon single crystal in the region of the crystallization boundary and in order to improve a radial homogeneity of G;

providing a heat shield annularly surrounding said silicon single crystal and having a lower edge; and connecting an element to the lower edge of the heat shield, said element annularly surrounding the silicon single crystal and said element having a face directed at the silicon single crystal, and said element face annularly surrounding the silicon single crystal substantially level with the crystallization boundary; and thermally affecting the silicon single crystal by using said element surrounding said crystal substantially level with the crystallization boundary region; and wherein said thermally affecting comprises exposing the silicon single crystal in the crystallization boundary region to heat radiation generated from said element and radiating from said face of said element;

thereby avoiding any substantial variation in the axial temperature gradient in the region of the crystallization boundary in the radial direction.

3. Method according to claim 1, comprising providing cooling above the element.

4. Method according to claim 2, comprising providing cooling above the element.

* * * * *